United States Patent
Kesling et al.

(10) Patent No.: US 9,251,110 B2
(45) Date of Patent: Feb. 2, 2016

(54) MODIFYING THE SPECTRAL ENERGY CONTENT OF A DATA BUS

(71) Applicant: Intel Corporation, Santa Clara, CA (US)

(72) Inventors: William Dawson Kesling, Davis, CA (US); Andrew W. Martwick, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 14/140,386

(22) Filed: Dec. 24, 2013

(65) Prior Publication Data

US 2015/0178237 A1    Jun. 25, 2015

(51) Int. Cl.
| | |
|---|---|
| *H04K 1/02* | (2006.01) |
| *G06F 13/40* | (2006.01) |
| *H03K 19/003* | (2006.01) |
| *H04L 1/20* | (2006.01) |

(52) U.S. Cl.
CPC ...... *G06F 13/4086* (2013.01); *H03K 19/00346* (2013.01); *H04L 1/20* (2013.01)

(58) Field of Classification Search
CPC ................ H03F 1/3247; H03F 1/3294; H03F 2201/3233; H04L 27/368; H04L 25/03343; H04L 1/0003; H04L 1/0071; H04L 5/0007; H04L 1/0009; H04L 27/0008

USPC .......................................... 375/296, 295, 219
See application file for complete search history.

(56) References Cited

U.S. PATENT DOCUMENTS

| | | | |
|---|---|---|---|
| 9,054,908 B2 | 6/2015 | Kesling et al. | |
| 2004/0156444 A1* | 8/2004 | Nakache et al. | 375/295 |
| 2006/0188001 A1* | 8/2006 | Mo et al. | 375/130 |
| 2015/0003506 A1 | 1/2015 | Kesling et al. | |

FOREIGN PATENT DOCUMENTS

| | | |
|---|---|---|
| WO | 2013048537 A1 | 4/2013 |
| WO | 2013147855 A1 | 10/2013 |

\* cited by examiner

*Primary Examiner* — Zewdu Kassa

(74) *Attorney, Agent, or Firm* — International IP Law Group, P.L.L.C.

(57) ABSTRACT

Techniques for reducing the spectral content of a data bus are described herein. An example of a device in accordance with the present techniques includes logic to obtain a present bit of data to be transmitted over a data bus and estimate a spectral energy contribution of the present bit at a frequency of interest. The device also includes logic to determine what effect inverting the present bit will have on a net spectral energy of the data bus at the frequency of interest when the present bit is transmitted over the data bus. The device also includes logic to invert the present bit to generate an inverted bit and transmit the inverted bit over the data bus if inverting the present bit reduces the net spectral energy of the data bus at the frequency of interest.

19 Claims, 8 Drawing Sheets

302

306

800

MODIFYING THE SPECTRAL ENERGY CONTENT OF A DATA BUS

TECHNICAL FIELD

This disclosure relates generally to techniques for modifying the spectral energy content of a data bus. More specifically, the disclosure describes techniques for modifying the spectral energy content of a data bus to reduce radio frequency interference produced by the data bus.

BACKGROUND

Data busses in a computing platform generally produce electromagnetic radiation that can be a main source of radio frequency interference (RFI) with wireless radio reception in mobile computing platforms such as tablets, smartphones, and portable personal computers. For example, a portable computing platform may have at least three radio antennas, with one or more in its base. In addition, such platforms typically support five or more radio bands, e.g., Wi-Fi (802.11a/b/g/n), Bluetooth technology, and various different cellular standards such as LTE and WiMax, among others.

DETAILED DESCRIPTION

The subject matter disclosed herein relates to techniques for modifying the spectral energy content of the digital signals present on a data bus. As used herein, the term "spectral energy content" or simply "spectral content" is used to refer to the magnitude and phase of the RFI generated by the data transmitted on a bus. The spectral content can be determined at one or more frequencies or ranges of frequencies. The spectral content information can be used to implement a spectral line coding technique that mitigates bus noise generated at frequency bands of interest by modifying the binary signal data before it is transmitted on the bus.

In some embodiments, the binary signal data can be modified by selectively inverting certain data bits to be transmitted over the data bus based on whether the inversion would reduce the spectral content of the data bus at the frequency or frequencies of interest. In some embodiments, the spectral content of the data bus can be determined using a phasor technique, as described below. The phasor for the digital data, before and after bit inversion, can be computed and used to determine whether the inversion will have a beneficial effect on the spectral content. Additional data, used to identify whether bits have been inverted, can be transmitted on the same data bus or on a separate side channel.

Figure 1:
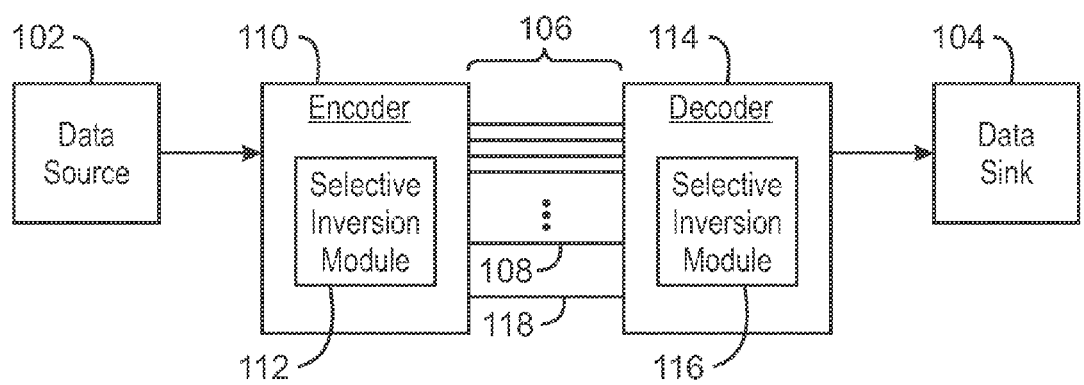
FIG. 1 is a block diagram of a communication system that uses selective inversion to modify the spectral content of a data bus.

FIG. 1 is a block diagram of a communication system that uses selective inversion to modify the spectral content of a data bus. The communication system 100 can be included in any type of computing device, including laptop computers, smart phones, tablet PCs, desktop computers, and server computers, among others. The communication system 100 can be used to communicate between internal components of a computing device, for example, between circuit chips coupled to the same circuit board. Additionally, the communication system 100 can be used for external communication between computing devices, for example, through a cable connector. Furthermore, the communication system 100 can use any suitable type of communication protocol, including a Universal Serial Bus (USB), Peripheral Component Interconnect (PCI), PCI Express (PCIe), among others, including proprietary communication protocols. In some embodiments, the communication system 100 is used to communicate data between a memory controller of a central processing unit and a memory device such as dynamic random access memory (DRAM).

In the communication system 100 of FIG. 1, digital data can be transmitted from a data source 102 to a data sink 104 through a data bus 106. For the sake of simplicity, the communication system 100 is described herein with reference to one direction of data transmission. However, the computing system 100 will generally include components that enable it to transmit data in both directions. The data bus 106 may include any suitable number of lanes, including 1, 2, 4, 8, 16, 32, 64 or 128 lanes for example. In some examples, the data bus 106 is a memory bus such as a double data rate (DDR) bus coupled to a main memory of a computer system. The data bus 106 may be a type of DDR bus referred to as a low-power DDR (LPDDR) bus.

The data source 102 is coupled to an encoder 110 that prepares the digital data for transmission on the data bus 106. For example, the encoder 110 may include a scrambler, a serializer, as well as circuitry for error coding, and encryption, among other components. The encoder 110 also includes a selective inversion module 112 that analyzes the data and determines whether to invert specific bits of data to be transmitted over the bus based on the effect of the inversion on the spectral content. Data transmitted over the bus is then received by a decoder 114 that has its own selective inversion module 116 that determines whether certain bits have been inverted and returns those bits that have been inverted back to their pre-inversion values.

In some examples, the selective inversion module 112 of the encoder 110 communicates inversion decisions to the selective inversion module 112 of the decoder 114. The inversion decisions can be communicated by inserting inversion identification data onto the regular lanes 108 of the data bus 106 or through a separate side channel 118. For example, if the data bus 106 is a Universal Serial Bus (USB) or other packet based protocol, the inversion identification data can be included in a header of each data packet. If the data bus 106 is a memory bus or an Input/Output (I/O) bus the inversion identification data may be transmitted to the decoder 114 through the side channel 118. As explained further in relation to FIG. 2, inversion decisions can be applied to single bits or to groups of bits.

In some examples, the encoding/decoding process described herein can be enabled and disabled. For example, the bit inversion process can be enabled or disabled by a user of the computing device. In some examples, a level of RFI can be measured and the bit inversion process can be automatically enabled or disabled by the computing device if the RFI exceeds a specified threshold or falls below a specified threshold.

Figure 2:
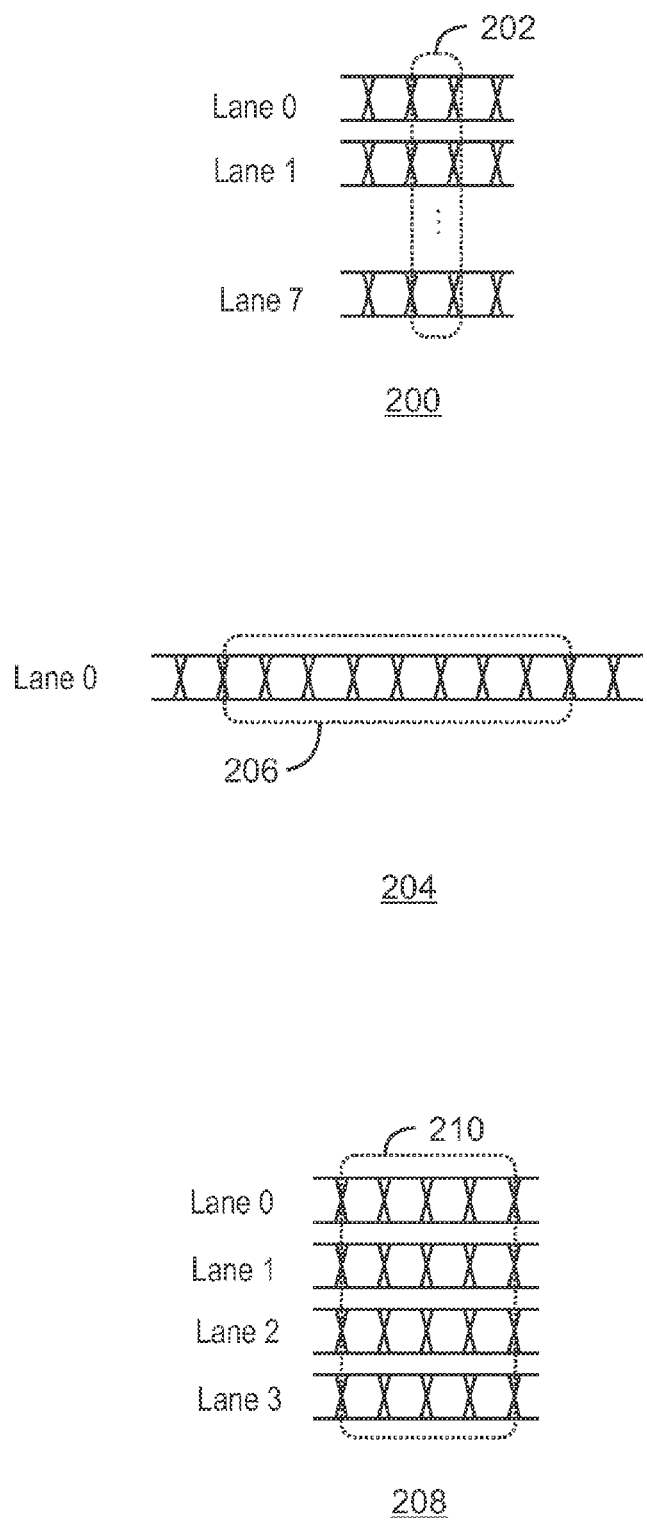
FIG. 2 shows a set of diagrams illustrating how bits can be grouped together so that the same inversion decision is applied to the entire group.

FIG. 2 shows a set of diagrams illustrating how bits can be grouped together so that the same inversion decision is applied to the entire group. Individual trapezoids represent bus data bits where the waveform can be either high or low. The duration of each bit value is referred to variously as a bit time, unit interval, bus transfer cycle or bus clock cycle. Each grouping of bits is referred to an inversion group. The timing diagram 200 shows an inversion group 202 that includes several parallel bits from adjacent lanes of the data bus. The bits are parallel in the sense that each bit is transmitted onto the bus during the same clock cycle. Furthermore, only a single bit from each lane is included in the inversion group 202. As an example, the inversion group 202 includes eight parallel bits from eight lanes of the data bus. However, any other suitable number of parallel bits can be included in the inversion group, such as 2, 4, 8, 16, or 32, among others. The inversion group 202 can include the parallel bits from all of the lanes of the data bus or a subset of the lanes of the data bus. The grouping of the lanes into inversion groups may depend in part on the target frequency of the interference generated by the bus and the spacing between the lanes. For example, the lanes of an inversion group may be selected so that the total distance between the outer lanes in the group is much less than the wavelength of the interference.

The timing diagram 204 shows an inversion group 206 that includes several sequential bits transmitted on a single lane of the data bus 106. As an example, the inversion group 206 includes eight sequential bits, or one byte, of data. However, any other suitable number of sequential bits can be included in the inversion group, such as 2, 4, 8, 16, or 32, among others. The size of the inversion group may be specified based on the specific communication protocol used, which may already group bits for the purpose of error coding for example. For example, in a USB 3.0 data bus that uses 8b10b encoding, the inversion group may include ten bits.

The timing diagram 208 shows an inversion group 210 that includes a number of parallel bits from different lanes of the data bus as well as a number of sequential data bits. In the example shown, the inversion group includes four sequential data bits from each of four parallel bus lanes, for a total of 16 bits. In the example, shown in diagram 208, it will be appreciated the four parallel data lines will be close enough together that they can be considered as a single RFI source. Any suitable number of parallel bits and serial bits may be used to form the inversion group.

The determination of whether to invert an inversion group is made based on a determination of the bus spectral content at the desired radio frequency, $f_r$, due to a string of sequential bus data values. In some embodiments, the spectral content of the bus is determined using a phasor technique, which can be implemented with lower sampling rate, less buffer memory and fewer processing resources compared to other techniques for analyzing the spectral content of a signal, such as the Fast Fourier Transform (FFT). The basic phasor calculation can be described by Equation 1 below.

$$N_s(f_r) = \sum_{b=1}^{n} x_b e^{-j2\pi b f_r / f_{BR}} \quad \text{(Eq. 1)}$$

In Equation 1, $N_s(f_r)$ is the spectral noise at frequency $f_r$, $x_b$ is the digital data at bus cycle b, $f_{BR}$ is the bus transfer rate, and n is the number of sequential bits used to determine the spectral noise. The term inside the summation is the phasor for a single unit interval. The spectral noise, $N_s(f_r)$, is the net phasor at the specified frequency, $f_r$, which is the sum of all unit interval phasors for the n unit intervals. The value of n is one, eight, and four for the inversion groups in cases 200, 204 and 208 of FIG. 2, respectively. Any suitable number can be used in general, such as 1, 2, 4, 8, 16, or 32, among others. The process described above may be repeated to obtain the net phasor for another frequency or range of frequencies. Furthermore, to obtain the spectral noise for a number of parallel bus lanes, $x_b$ can be the sum of the digital data in one clock cycle on all of the bus lanes included in the inversion group.

The phasor technique described herein operates by determining the spectral content of the digital data based on the pulse sampling function. In many cases, the bus waveform can be approximated by convolution of the pulse sampling function with the bus pulse response. Since convolution in the time domain is equivalent to multiplication in the frequency domain in such cases, the effect of the pulse response on the spectral components of the signal can be ignored for the purpose of comparing spectra arising from different digital data. In other cases, the phasor technique can be used with modification to approximate the relative spectral energy of the data waveform from the underlying digital data.

Figure 3:
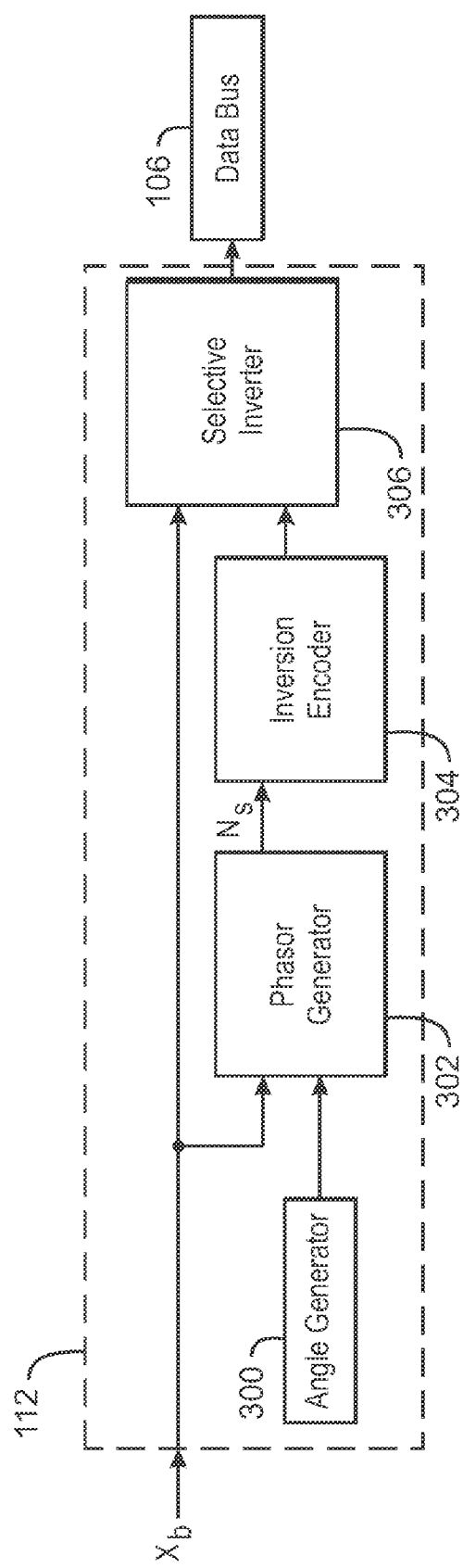
FIG. 3 is a block diagram of an example of a selective inversion module.

FIG. 3 is a block diagram of an example of a selective inversion module 112. The selective inversion module 112 may be included in an encoder 110 as shown in FIG. 1. The selective inversion module 112 uses the data on the data bus 106 to generate the net phasor for one or more specified frequencies or ranges of frequencies. The selective inversion module 112 can be implemented by any suitable hardware or combination of hardware and programming code such as software or firmware. For example, the selective inversion module 112 can be implemented in digital logic circuits, processors or some combination thereof. In some embodiments, one or more components of the selective inversion module 112 may be implemented as programming code running on a general purpose processors, ASIC, or FPGA, for example. Accordingly, a computing device operable to carry out the techniques described herein may include a tangible, non-transitory storage medium for storing programming code configured to implement the techniques disclosed herein. The bus 106 may be any suitable type of bus including a Universal Serial Bus (USB), Peripheral Component Interconnect (PCI), PCIe (PCI Express), or a DRAM memory bus, LPDDR memory bus, and Wide I/O, among others.

The selective inversion module 112 includes an angle generator 300, a phasor generator 302, and inversion encoder 304, a selective inverter 306. The selective inversion module of 112 is communicatively coupled to a data source, such as the data source 102 shown in FIG. 2. The selective inversion module of 112 receives bit data, $x_b$, and determines whether to invert the data before transmitting the data over the data bus 106, based on which configuration, inverted or non-inverted, results in a lower level of RF interference. In some examples, the bit data, $x_b$, is received from the output of another encoding element, such as a scrambler, for example. The digital data at cycle b, $x_b$, is received by the phasor generator 302 and the selective inverter 306.

The angle generator 200 generates a relative phase angle value, based on the relative bit time and the transfer rate of the data bus. The angle generator 300 computes the value of the exponent $2\pi b f_r / f_{BR}$ from Equation 1 above. At each bit time, the angle generator 200 updates the phase angle to correspond with the bit time of the current bit data received from the data source. The phasor generator 302 receives the phase angle and the bit data, $x_b$, and computes the phasor using, for example, Equation 1 described above. The phasor generator 302 generates the net phasor for the inversion group at one or more specified frequencies, $f_r$, which may be referred to herein as the phasor frequency or phasor frequencies. The net phasor can then be output to the inversion encoder 304 and used by an encoding scheme that will reduce the magnitude of the interference generated by the data bus 106 at the one or more phasor frequencies. The phasor frequency or frequencies may be specified by a user or preprogrammed into the selective inversion module 112. For example, the phasor frequency may be a specified as a frequency at which the selective inversion module 112 is to reduce the RFI produced by the data bus 106, such as a frequency used by an RF communication device within the same electronic device.

Any number of bits may be used to generate the phasor depending on the design considerations of a particular implementation. In some examples, the number of data bits used to compute the phasor will depend on the size and configuration of the inversion group, which is discusses above in relation to FIG. 2. For example, if the inversion group includes four serial bits and four parallel bits as shown in the diagram 208 of FIG. 2, the phasor calculation will include sixteen total data bits.

The inversion encoder 304 receives the phasors computed by the phasor generator 302 and determines whether the bit data associated with the particular inversion group should be inverted. The encoding decision is sent from the inversion encoder 304 to the selective inverter 306, which applies the inversion decision to the bit data of the inversion group and transmits the resulting data on the data bus 106. Examples of the components described in FIG. 3 for the case of an inversion group that includes eight transfer cycles are described in more detail below in relation to FIGS. 4-7.

Figure 4:
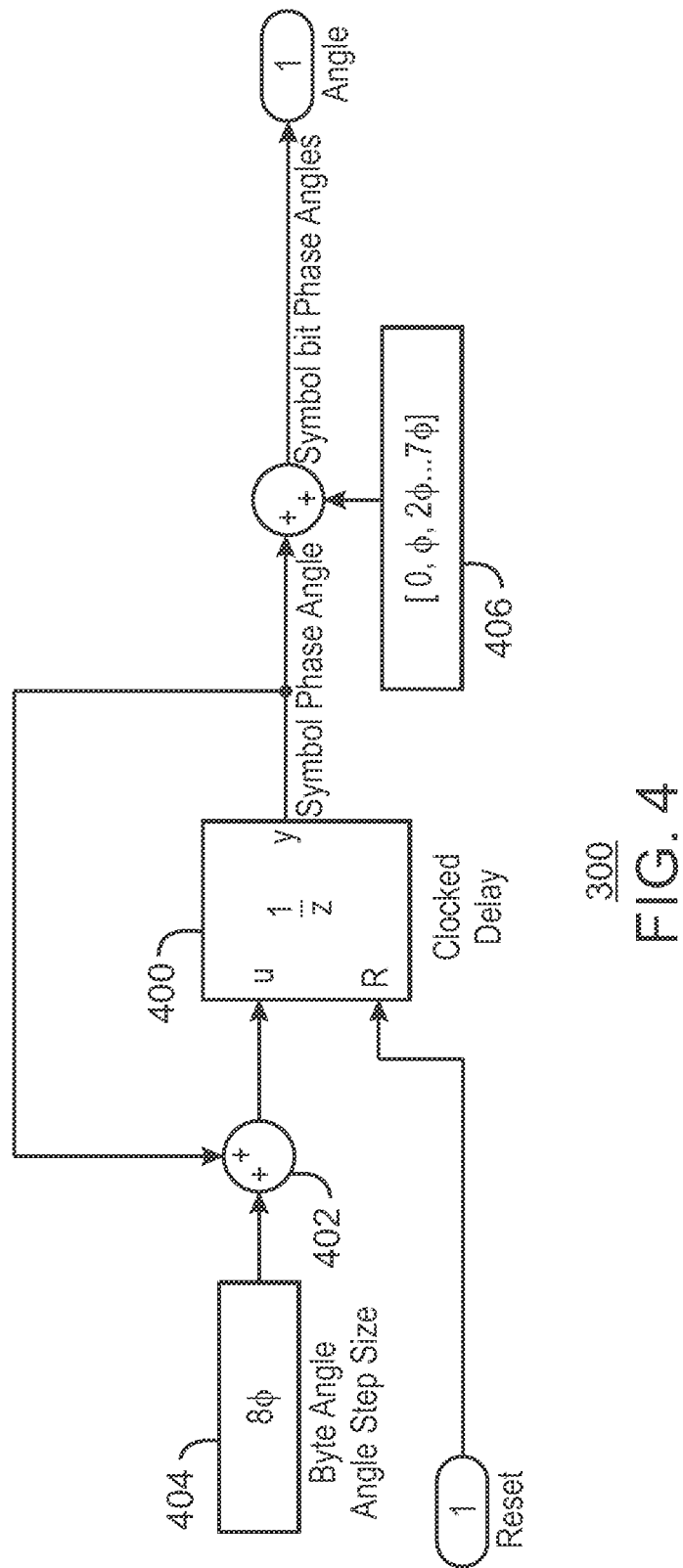
FIG. 4 is a block diagram of an example of an angle generator.

FIG. 4 is a block diagram of an example of an angle generator 300. In some examples, the angle generator 300 may be implemented in computer logic, such as flip flops, data storage elements, logic gates, and the like. In some examples, the angle generator 300 may be implemented in a processor executing programming code. The example angle generator 300 of FIG. 4 is clocked at the byte rate which is one eighth of the transfer rate of the corresponding data bus 106 to which it is coupled and generates eight phase angles during each clock cycle.

In the example of FIG. 4, the angle generator 300 includes a phase accumulation loop that includes digital clocked delay 400, a summer 402, and a register block 404. Block 404 outputs the byte phase angle, $8\phi$, where $\phi$ is the phase angle at the phasor frequency, $f_r$, corresponding to one bit time, $T_{bit}$, as expressed in Equation 2 below.

$$\phi = 2\pi b f_r / f_{BR} = -2\pi b f_r \cdot T_{bit} \quad \text{(Eq. 2)}$$

The digital delay 400 is clocked at the byte rate of the data bus 106. At each clock cycle, the delay 400 outputs a phase angle, and the summer 402 adds this to the output of block 404. In this way, the output of the delay 400 increments by the byte phase angle step size at each clock cycle.

Block 406 outputs eight phase angle values, $0, \phi, 2\phi, 3\phi, 4\phi, 5\phi, 6\phi$, and $7\phi$. Each phase angle value corresponds to the relative phase angle for a specific bit time of the eight bit times included in the output of the angle generator 300. Each of the eight phase angle values is summed with the output of the delay 400 to generate eight output phase angles, which are output from the angle generator 300 to the phasor generator 302.

Figure 5:
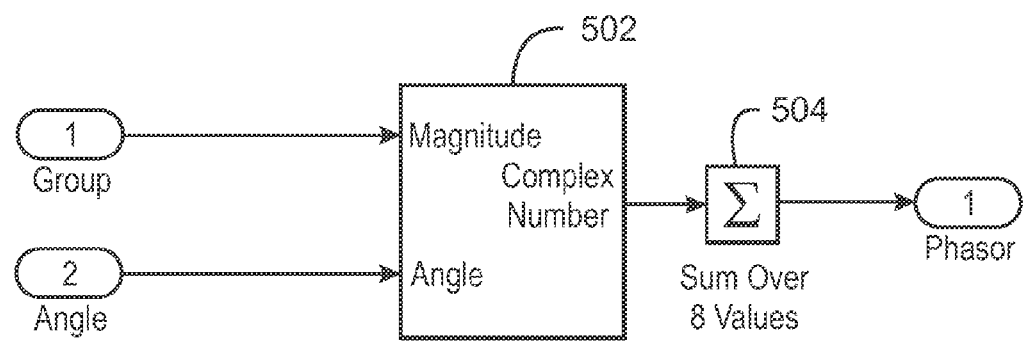
FIG. 5 is a block diagram of an example of a phasor generator.

FIG. 5 is a block diagram of an example of a phasor generator 302. In some examples, the phasor generator 302 may be implemented in computer logic, such as flip flops, data storage elements, logic gates, and the like. In some examples, the phasor generator 302 may be implemented in a processor executing programming code. The example phasor generator 302 of FIG. 5 includes a complex number generator 502 and summer 504.

The complex number generator 502 receives an inversion group byte composed of eight consecutive bus data values, $x_0, x_1, x_2, x_3, x_4, x_5, x_6, x_7$, where $x_b$ is the data destined for bus cycle b of the inversion group. The complex number generator 502 computes the unit interval phasor based on the received bus data and angle data. In the example shown in FIG. 5, the phasor generator 302 sums the eight unit interval phasors to generate a net phasor for the inversion group. The net phasor for an inversion group is referred to herein as the inversion group phasor. The number of unit interval phasors included in the inversion group phasor may vary depending on the design considerations of a particular implementation. If inversion group includes 8 bits, the phasor generator 302 may output one inversion group phasor after each byte time.

Figure 6:
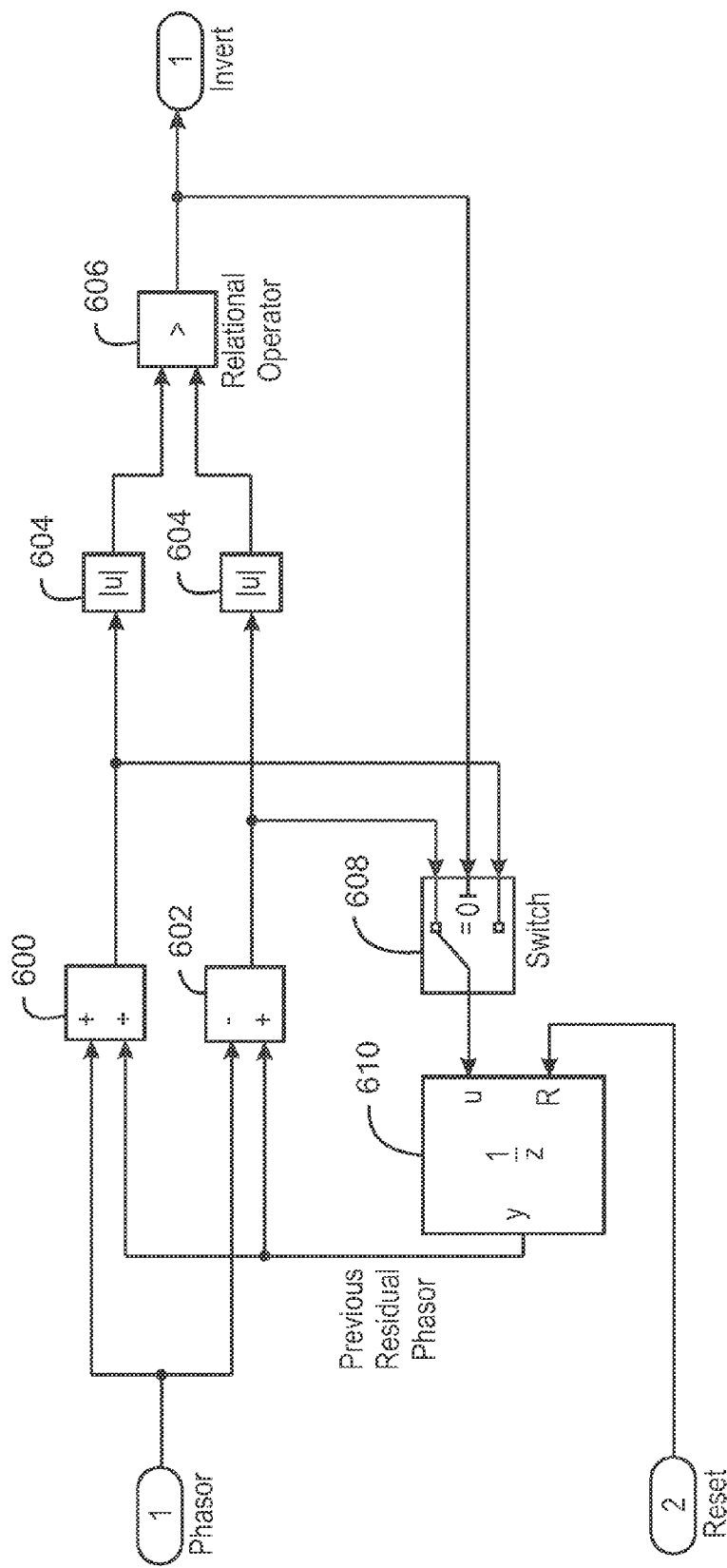
FIG. 6 is a block diagram of an example of an inversion encoder.

FIG. 6 is a block diagram of an example of an inversion encoder 304. In some examples, the inversion encoder 304 may be implemented in computer logic, such as flip flops, data storage elements, logic gates, and the like. In some examples, the inversion encoder 304 may be implemented in a processor executing programming code.

The example inversion encoder 304 of FIG. 6 receives the inversion group phasor from the phasor generator 302 and generates two accumulated phasors. An accumulated phasor is generated by adding the phasor for the current clock cycle to the previous accumulated phasor generated in the previous clock cycle, which is referred to herein as the residual phasor. A first phasor accumulator, referred to herein as the non-inverted phasor accumulator 600, generates an accumulated phasor for the case in which the received inversion group phasor is not inverted. A second phasor accumulator, referred to herein as the inverted phasor accumulator 602, generates an accumulated phasor for the case in which the received inversion group phasor is inverted. The magnitude of each of the accumulated phasors represents the net un-canceled spectral noise at the phasor frequency that will exist for that specific inversion decision. The selective inversion module 112 operates by reducing the net un-canceled spectral noise at the phasor frequency.

The output of each phasor accumulator 600 and 602 is output to respective blocks 604 that compute the magnitude of each accumulated phasor. The magnitude of each accumulated phasor is compared by the relational operator 606. The output of the relational operator 606, which is used as an inversion signal, indicates which phasor magnitude is greater. The decision to invert or not invert is made such that the resulting accumulated phasor of the transmitted data will be the lower of the two cases. Thus, if the magnitude of the output of the inverted phasor accumulator 602 is lower than the magnitude of the output of the non-inverted phasor accumulator 600, then the current inversion group will be inverted before being transmitted on the data bus 106. If the magnitude of the output of the non-inverted phasor accumulator 600 is lower than the magnitude of the output of the inverted phasor accumulator 602, then the current inversion group will not be inverted before being transmitted on the data bus 106.

The inversion signal is output from the relational operator 606 to the selective inverter 306. Additionally, the inversion signal is output from the relational operator 606 to a multiplexer or switch 608 that is used to select the output of the inverted phasor accumulator 602 or the output of the non-inverted phasor accumulator 600 as the next residual phasor for use in the next clock cycle. The output of the switch 608 is sent to a clocked delay 610, which stores the accumulated phasor and outputs the accumulated phasor in the next clock cycle for addition to the next inversion group, as described above.

Figure 7:
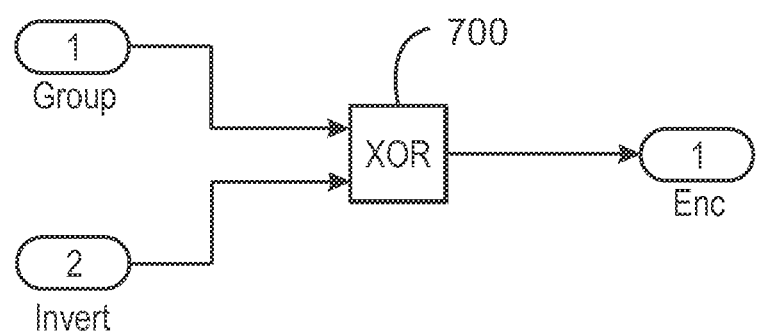
FIG. 7 is a block diagram of an example of a selective inverter.

FIG. 7 is a block diagram of an example of a selective inverter 306. In some examples, the selective inverter 306 is be implemented in computer logic, such as flip flops, data storage elements, logic gates, and the like. In some examples, the selective inverter 306 is be implemented in a processor executing programming code.

The example selective inverter 306 of FIG. 7 receives the inversion group data, $x_0$, $x_1$, $x_2$, $x_3$, $x_4$, $x_5$, $x_6$, $x_7$, and the inversion signal from the output of the inversion encoder 304. The selective inverter 306 can include an inversion operator 700 that inverts the bit data included in the inversion group depending on the value of the inversion signal. If the bit data is inverted, each individual bit in the inversion group is inverted such that 1's become 0's and 0's become 1's. In some embodiments, the inversion operator 700 applies an "exclusive or" (XOR) operation to the bit data and the inversion signal.

Figure 8:
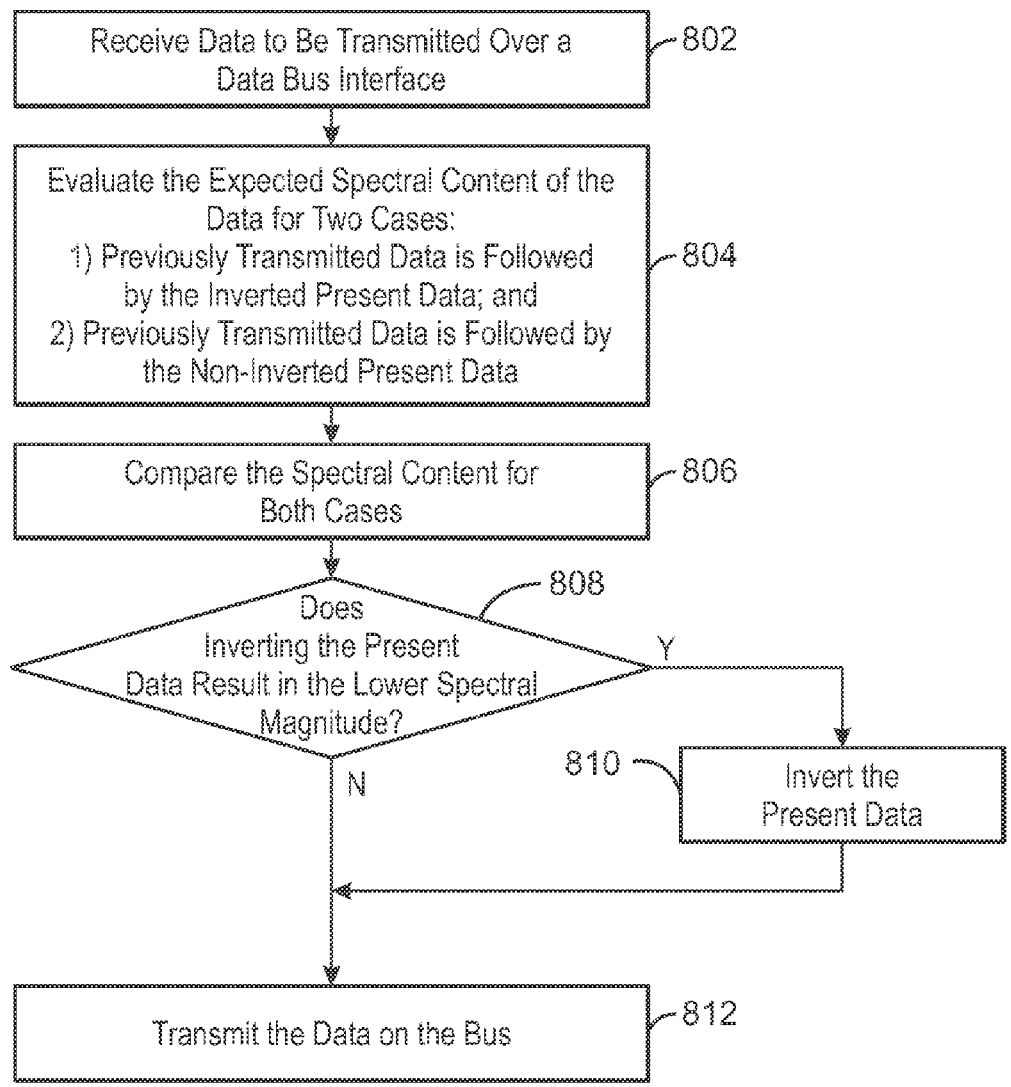
FIG. 8 is a process flow diagram summarizing a method of reducing the spectral content of a data bus.

FIG. 8 is a process flow diagram summarizing a method of reducing the spectral content of a data bus. The method 800 can be performed by any electronic device that transmits data over a bus. The method 800 may be implemented by logic embodied in hardware, such as logic circuitry or one or more processors configured to execute instructions stored in a non-transitory, computer-readable medium. The ordering of blocks 802 to 812 are not intended to indicate that the operations described must occur in a particular order. Indeed, many of the operations described in relation to the method 800 can occur in an order different from what is shown in FIG. 8 or even in parallel. The method may begin at block 802, wherein data to be transmitted over a data bus interface is received. For example, the data may include one or more bits of data included in an inversion group, such as one of the inversion groups discussed above in relation to FIG. 2. The data received at block 802 may be referred to as the "present data."

At block 804, the expected spectral content of the data bus is evaluated. The expected spectral content is an estimate of the RFI that will be generated by the data bus at a specified frequency of interest when the present data is transmitted. In some embodiments, the expected spectral content of the data bus is evaluated for two cases. In the first case, the present data is inverted. In the second case, the present data is not inverted. The expected spectral content can be determined by computing phasors. For example, a phasor can be generated for the present data and this phasor can be combined with a residual phasor that is generated for data previously transmitted on the bus. The phasor for the present data can be added to the residual phasor to generate a phasor referred to herein as the non-inverted accumulated phasor. The phasor for the present data can also be inverted and the inverted phasor added to the residual phasor to generate a phasor referred to herein as the inverted accumulated phasor.

At block 806, the expected spectral content of the data bus is compared for both cases. For example, the magnitude of the non-inverted accumulated phasor can be compared with the magnitude of the inverted accumulated phasor.

At block 808, a decision is made regarding whether inverting the present data results in a lower spectral magnitude. If inverting the present data does not result in a lower spectral magnitude, the process flow proceeds to block 812 and the data is transmitted on the data bus without being inverted.

If inverting the present data results in a lower spectral magnitude, the process flow proceeds from block 808 to block 810 and the present data is inverted. To invert the data, each bit in the inversion group is flipped from its present state to the opposite state. For example, zeros are converted to ones and ones are converted zeros. After the present data is inverted, the process flow proceeds to block 812 and the present data is transmitted on the data bus in the inverted state to the receiving device. The inversion decision is also transmitted to the receiving device, either on the data bus or via a sideband signal. Transmitting the inversion decision to the receiving device enables the receiving device to re-create the original data.

EXAMPLE 1

An electronic device is described herein. The electronic device includes logic to obtain a present bit of data to be transmitted over a data bus and estimate a spectral energy contribution of the present bit at a frequency of interest. The electronic device also includes logic to determine what effect inverting the present bit will have on a net spectral energy of the data bus at the frequency of interest when the present bit is transmitted over the data bus. The electronic device also includes logic to invert the present bit to generate an inverted bit and transmit the inverted bit over the data bus if inverting the present bit reduces the net spectral energy of the data bus at the frequency of interest. The bit of data may be included in an inversion group comprising a plurality of bits to which a same inversion decision is applied.

In some examples, the logic to determine what effect inverting the present bit will have on the net spectral energy of the data bus is to generate a phasor based, at least in part, on the present bit, and combine the phasor with a residual phasor generated for one or more bits previously transmitted on the bus. For example, the logic may add the phasor to the residual phasor to generate a non-inverted accumulated phasor, invert the phasor and add the inverted phasor to the residual phasor to generate an inverted accumulated phasor, and compare a magnitude of the non-inverted accumulated phasor with a magnitude of the inverted accumulated phasor.

In some examples, the logic to determine what effect inverting the present bit will have on the net spectral energy of the data bus is to use the non-inverted accumulated phasor as the residual phasor for the next clock cycle if the magnitude of the non-inverted accumulated phasor is less than the magnitude of the inverted accumulated phasor. In some examples, the data bus is a Universal Serial Bus (USB) data bus.

EXAMPLE 2

An electronic device is described herein. The electronic device can include a phasor generator to obtain a bit of data to be transmitted over the data bus and estimate a spectral energy contribution of the present bit at a frequency of interest. The electronic device can also include an inversion encoder to determine what effect inverting the present bit will have on a net spectral energy of the data bus at the frequency of interest when the present bit is transmitted over the data bus. The inversion encoder can generate an inversion signal to send to a selective inverter, wherein the value of the inversion signal is determined based on whether inverting the bit reduces the net spectral energy of the data bus at the frequency of interest.

In some examples, the phasor generator is to generate a phasor based, at least in part, on the bit of data to estimate the spectral energy contribution of the present bit. To determine what effect inverting the present bit will have on a net spectral energy of the data bus, the inversion encoder can receive a residual phasor generated for one or more bits previously transmitted on the data bus, and add the phasor to the residual phasor to generate a non-inverted accumulated phasor. The inversion encoder can also invert the phasor and add the inverted phasor to the residual phasor to generate an inverted accumulated phasor. The inversion encoder can also compare the inverted accumulated phasor and the non-inverted phasor to determine whether to invert the bit of data before transmitting the bit of data over the data bus. The inversion encoder may also use the inverted accumulated phasor or the non-inverted accumulated phasor as a next residual phasor for a next clock cycle depending on which one of the inverted accumulated phasor or the non-inverted accumulated phasor has a higher magnitude.

In some examples, the bit of data is included in an inversion group comprising a plurality of bits to which a same inversion decision is applied. The plurality of bits of the inversion group can include bits to be transmitted serially on a single lane of the data bus. The plurality of bits of the inversion group can include bits to be transmitted during a same clock cycle on parallel lanes of the data bus. In some example, the data bus is a Universal Serial Bus (USB) data bus.

EXAMPLE 3

A non-transitory, tangible, computer-readable medium is described herein. The computer-readable medium includes instructions to direct the actions of a processor. The instructions direct the processor to obtain a bit of data to be transmitted over a data bus and estimate a spectral energy contribution of the present bit at a frequency of interest. The instructions also direct the processor to determine what effect inverting the bit of data will have on a net spectral energy of the data bus at the frequency of interest when the bit of data is transmitted over the data bus. The instructions also direct the processor to invert the bit of data to generate an inverted bit and transmit the inverted bit over the data bus if inverting the bit reduces the net spectral energy of the data bus at the frequency of interest. The bit of data can be included in an inversion group that includes a plurality of bits to which a same inversion decision is applied.

In some examples, the instructions that direct the processor to determine what effect inverting the bit of data will have on the net spectral energy of the data bus direct the processor to generate a phasor based, at least in part, on the bit of data, and combine the phasor with a residual phasor generated for one or more bits previously transmitted on the bus. In some examples, the instructions direct the processor to add the phasor to the residual phasor to generate a non-inverted accumulated phasor, invert the phasor and add the inverted phasor to the residual phasor to generate an inverted accumulated phasor, and compare a magnitude of the non-inverted accumulated phasor with a magnitude of the inverted accumulated phasor.

The instructions may also direct the processor to use the inverted accumulated phasor or the non-inverted accumulated phasor as the next residual phasor for the next clock cycle depending on which one of the inverted accumulated phasor or the non-inverted accumulated phasor has a higher magnitude.

Some embodiments may be implemented in one or a combination of hardware, firmware, and software. Some embodiments may also be implemented as instructions stored on the tangible non-transitory machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others. In some example, the data bus is a Universal Serial Bus (USB) data bus.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An electronic device, comprising:
    logic to obtain a present bit of data to be transmitted over a data bus and estimate a spectral energy contribution of the present bit at a frequency of interest;
    logic to determine what effect inverting the present bit will have on a net spectral energy of the data bus at the frequency of interest when the present bit is transmitted over the data bus; and
    logic to invert the present bit to generate an inverted bit and transmit the inverted bit over the data bus if inverting the present bit reduces the net spectral energy of the data bus at the frequency of interest;
    wherein the logic to determine what effect inverting the present bit will have on the net spectral energy of the data bus is to:
    generate a phasor based, at least in part, on the present bit; and
    combine the phasor with a residual phasor generated for one or more bits previously transmitted on the bus.

2. The electronic device of claim 1, wherein the bit of data is included in an inversion group comprising a plurality of bits to which a same inversion decision is applied.

3. The electronic device of claim 1, wherein the logic to determine what effect inverting the present bit will have on the net spectral energy of the data bus is to:
    add the phasor to the residual phasor to generate a non-inverted accumulated phasor;
    invert the phasor and add the inverted phasor to the residual phasor to generate an inverted accumulated phasor; and
    compare a magnitude of the non-inverted accumulated phasor with a magnitude of the inverted accumulated phasor.

4. The electronic device of claim 3, wherein the logic to determine what effect inverting the present bit will have on the net spectral energy of the data bus is to:
    use the non-inverted accumulated phasor as the residual phasor for the next clock cycle if the magnitude of the non-inverted accumulated phasor is less than the magnitude of the inverted accumulated phasor.

5. The electronic device of claim 1, wherein the data bus is a Universal Serial Bus (USB) data bus.

6. The electronic device of claim 1, wherein the data bus is a Double Data Rate (DDR) data bus.

7. An electronic device, comprising:
    a phasor generator to obtain a present bit of data to be transmitted over the data bus and generate a phasor based, at least in part, on the present bit of data to estimate a spectral energy contribution of the present bit of data at a frequency of interest; and
    an inversion encoder to:
    receive a residual phasor generated for one or more bits previously transmitted on the data bus;
    add the phasor to the residual phasor to generate a non-inverted accumulated phasor;
    invert the phasor and add the inverted phasor to the residual phasor to generate an inverted accumulated phasor; and
    compare the inverted accumulated phasor and the non-inverted accumulated phasor to determine whether to invert the bit of data before transmitting the bit of data over the data bus.

8. The electronic device of claim 7, wherein the inversion encoder is to use the inverted accumulated phasor or the non-inverted accumulated phasor as a next residual phasor for a next clock cycle depending on which one of the inverted accumulated phasor or the non-inverted accumulated phasor has a higher magnitude.

9. The electronic device of claim 7, wherein the bit of data is included in an inversion group comprising a plurality of bits to which a same inversion decision is applied.

10. The electronic device of claim 9, wherein the plurality of bits of the inversion group comprises bits to be transmitted serially on a single lane of the data bus.

11. The electronic device of claim 9, wherein the plurality of bits of the inversion group comprises bits to be transmitted during a same clock cycle on parallel lanes of the data bus.

12. The electronic device of claim 7, wherein the data bus is a Universal Serial Bus (USB) data bus.

13. The electronic device of claim 12, wherein the data bus is a Double Data Rate (DDR) data bus.

14. A non-transitory, tangible, computer-readable medium, comprising instructions to direct a processor to:
    obtain a bit of data to be transmitted over a data bus and estimate a spectral energy contribution of the bit of data at a frequency of interest;
    determine what effect inverting the bit of data will have on a net spectral energy of the data bus at the frequency of interest when the bit of data is transmitted over the data bus; and
    invert the bit of data to generate an inverted bit and transmit the inverted bit over the data bus if inverting the bit of data reduces the net spectral energy of the data bus at the frequency of interest;
    wherein the instructions to direct the processor to determine what effect inverting the bit will have on the net spectral energy of the data bus direct the processor to:
    generate a phasor based, at least in part, on the bit; and
    combine the phasor with a residual phasor generated for one or more bits previously transmitted on the bus.

15. The non-transitory, tangible, computer-readable medium of claim 14, wherein the bit of data is included in an inversion group comprising a plurality of bits to which a same inversion decision is applied.

16. The non-transitory, tangible, computer-readable medium of claim 14, wherein the instructions to direct the processor to determine what effect inverting the bit will have on the net spectral energy of the data bus direct the processor to:
    add the phasor to the residual phasor to generate a non-inverted accumulated phasor;
    invert the phasor and add the inverted phasor to the residual phasor to generate an inverted accumulated phasor; and
    compare a magnitude of the non-inverted accumulated phasor with a magnitude of the inverted accumulated phasor.

17. The non-transitory, tangible, computer-readable medium of claim 16, comprising instructions to direct the processor to:
    use the inverted accumulated phasor or the non-inverted accumulated phasor as the next residual phasor for the next clock cycle depending on which one of the inverted accumulated phasor or the non-inverted accumulated phasor has a higher magnitude.

18. The non-transitory, tangible, computer-readable medium of claim 14, wherein the data bus is a Universal Serial Bus (USB) data bus.

19. The non-transitory, tangible, computer-readable medium of claim 14, wherein the data bus is a Double Data Rate (DDR) data bus.

* * * * *